United States Patent [19]
Hilsum et al.

[11] Patent Number: 4,529,968
[45] Date of Patent: Jul. 16, 1985

[54] TOUCH SENSITIVE LIQUID CRYSTAL SWITCH

[75] Inventors: Cyril Hilsum; Edward P. Raynes, both of Malvern, England

[73] Assignee: The Secretary of State for Defence in Her Britannic Majesty's Government of the United Kingdom of Great Britain and Northern Ireland, London, England

[21] Appl. No.: 440,590

[22] Filed: Nov. 10, 1982

[30] Foreign Application Priority Data

Nov. 16, 1981 [GB] United Kingdom ............... 8134496
Mar. 8, 1982 [GB] United Kingdom ............... 8206709

[51] Int. Cl.³ .................... G06F 3/02; G09G 3/18
[52] U.S. Cl. .................... 340/365 C; 200/DIG. 1; 340/712; 340/784; 340/765
[58] Field of Search ............... 340/365 C, 712, 784, 340/765; 200/DIG. 1; 361/287, 288, 290, 291; 400/479.1

[56] References Cited

U.S. PATENT DOCUMENTS

| | | |
|---|---|---|
| 3,482,241 | 12/1969 | Johnson . |
| 3,815,127 | 6/1974 | Blumke ............... 340/365 C |
| 4,224,615 | 9/1980 | Penz ..................... 340/712 |
| 4,290,061 | 9/1981 | Serrano ................. 340/712 |
| 4,313,108 | 1/1982 | Yoshida ................ 340/712 |

FOREIGN PATENT DOCUMENTS 1553563 10/1979 United Kingdom .
2033632 5/1981 United Kingdom .

*Primary Examiner*—James J. Groody
*Attorney, Agent, or Firm*—Cushman, Darby & Cushman

[57] ABSTRACT

A touch sensitive switch with a liquid crystal cell and a circuit for measuring capacitive changes when the cell is deformed by touch. The cell has a layer of a liquid crystal material between slides bearing electrodes. Capacitive changes are detected for example by a comparator or by a bridge circuit which includes one or more cells. Touching one cell unbalances the bridge. The area of cell that is touched may be coincident with or separate from a display area. For some types of cells extra sensitivity is achieved by maintaining a voltage across the cell between a critical and saturation value.

12 Claims, 8 Drawing Figures

TOUCH SENSITIVE LIQUID CRYSTAL SWITCH

The invention relates to touch sensitive switches.

There are many touch sensitive switches. Some rely on sensing a change in capacitance when touched by a human finger. Examples of these are found in lifts (elevators) etc. U.K. Patent Specification No. 1,553,563 describes a liquid crystal display having a front outer electrode that is touched by the operator to switch the display ON and OFF. The action of touching the front electrode changes the capacitance of circuits connected thereto. This touch switch has the feature that the touched area also displays information, useful where a large number of switches are employed.

Another type of touch switch uses a resilient upper sheet that is slighly deformed by touch. The flexible sheet carries rows of spaced electrodes separated from orthogonally arranged column electrodes on a fixed base sheet. The two sets of electrodes form a matrix. On depressing the flexible sheet local contact is made between a row and a column electrode. With suitable materials small deflections of the flexible sheet are sufficient to cause contact between the two electrodes. U.K. Patent Specification No. 2,033,632 A describes such a switch. A feature of this switch is that it is separated from any display it controls e.g. an air traffic control cathode ray tube consol.

A switch according to this invention utilises the capacitive changes in a liquid crystal cell when deformed by touch. When appropriate voltages are applied to the cell it is very sensitive to physical changes in layer thickness.

A liquid crystal cell comprises a thin layer of a liquid crystal material contained between two walls carrying electrode structures on their inner faces. This forms a capacitor due to the highly resistive liquid crystal material between opposing electrodes.

Local deformation of the walls by touching causes a change in capacitance. This arises for two reasons. Capacitance is proportional to layer thickness i.e. wall separation and therefore changes in layer thickness give rise to changes in capacitance. More significant capacitance changes are causes by the flow and change of alignment of liquid crystal molecules in the deformed area. For some types of displays this flow of liquid crystal material gives an observable change in optical transmission. Since the capacitance change is due to a physical movement of the molecules and cell walls it is immaterial whether or not an operator's hand is gloved. This contrasts with some prior art devices where a good electric contact with an operator is necessary. A capacitance change also occurs when the capacitance reverts to its original value on removal of the deforming pressure.

According to the invention a touch switch comprises a liquid crystal cell and means for detecting a change in cell capacitance when the cell is deformed, the cell comprising a layer of a liquid crystal material contained between walls bearing opposing electrode structures.

The liquid crystal material may be nematic or cholesteric with a positive or negative dielectric anisotropy. The cell walls inner surface may be treated to give homogeneous molecular alignment (molecules parallel to wall surface) in a single direction e.g. by oblique evaporation of magnesium, fluoride or silicon monoxide at a grazing angle of 15° to 45°. Alternatively the walls may be unidirectionally rubbed e.g. with a soft tissue or coated with a layer of poly vinyl alchol and rubbed to give a molecular tilt of about 2° at the wall surface. Oblique evaporation at an angle of less than 15° may also be used to give high molecular tilt (e.g. 30°) plus alignment. Such alignment techniques are described in U.K. Patent Specification No. 1,472,247. The cell walls may be treated to give homeotropic alignment (molecules perpendicular to cell walls) e.g. by cleaning followed by dipping in a surfactant such as lecithin.

Using these alignment techniques various well-known types of display cells may be constructed e.g. the twisted nematic where the homogeneous alignment directions are orthogonal, or parallel nematic where the homogeneous alignment directions are parallel. Both these cells use nematic material with positive dielectric anisotropy with or without dyes and may include an amount of cholesteric material.

Additionally the display cell may operate as a phase change device with long or short pitch cholesteric material, or a dynamic scattering device. Dyes may be added to the material.

The change in capacitance may be measured by any suitable capacitance instrument e.g. a capacitance meter, capacitance bridge, lock in amplifier, or bridge with reference capacitor. In this latter case a voltage is supplied to the display cell and a reference capacitor in series. The voltage developed across the display cell is a measure of its capacitance.

When using displays employing high surface tilt e.g. 30° the voltage level across the cell is not critical. However for lower tilt angles e.g. below 10° the cell capacitance is much more sensitive to deformation if the voltage across the cell is above a threshold value and below an upper limit.

The detected change may be used to switch a liquid crystal display cell ON or OFF, used to switch a light source, switch a sound source, or switch any other electrically switchable device.

The display cell and touch switch may be separate cells, different parts of one cell, or the same cell.

The invention will now be described by way of example only with reference to the accompanying drawings of which:

Figure 1:
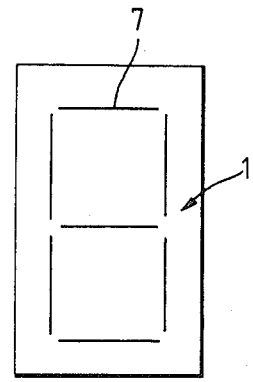
FIGS. 1 and 2 are respectively front and cross sectional views of a combined touch switch and display cell.
Figure 2:
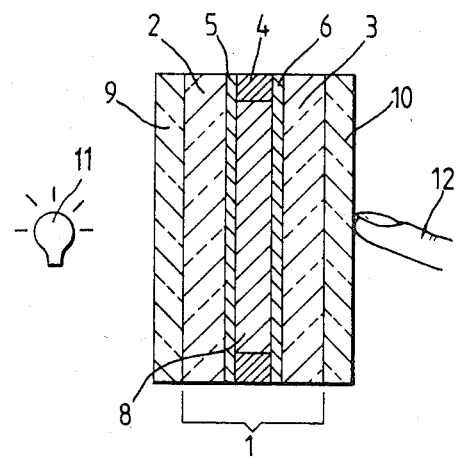

As shown in FIGS. 1, 2 a liquid crystal cell 1 comprises two 2 mm thick glass walls 2, 3 spaced 12 μm apart by a spacer ring 4. Electrode structures 5, 6 e.g. a layer of tin oxide, forming a seven bar format 7 are formed on the inner faces of these walls 2, 3. Between the walls 2, 3 is a layer 8 of nematic liquid crystal material. It may also contain a small amount of cholesteric material and or dye. Prior to assembly the walls 2, 3 inner surface is treated e.g. by unidirectional rubbing with a soft tissue or oblique evaporation of $MgF_2$.

On assembly the rubbing (alignment) directions are arranged to be orthogonal. As a result the liquid crystal molecules are surface aligned with the rubbing direction with a progressive 90° twist across the layer 8 thickness. This is known as a twisted nematic cell. Polariser 9, 10 are located either side the cell 1 with their optic axis parallel to the rubbing direction on the adjacent wall. With such an arrangement light from a source 11 is transmitted through the cell 1 when it is an OFF, zero applied voltage, state. Alternatively the polarizer 9, 10 may be arranged with their optical axis parallel to another and to one alignment direction. In this case no light is transmitted through the cell 1 in its OFF state. When a suitable voltage is applied to the cell electrode 5, 6 light is transmitted where the liquid crystal molecules align themselves parallel to the applied electric field. This light transmission occurs only at electrodes to which the voltage is applied so that numerals 0 to 9 can be displayed by selective application of voltages to the seven bar electrode structure 7. Alignment techniques for low and high surface molecular tilt are described in U.K. Patent Specification Nos. 1,472,247 and 1,478,592.

Liquid crystal cells employing effects other than the twisted nematic effect have a similar construction but different surface alignment and different liquid crystal materials which may include dissolved dyes. For some of these effects one or even no polarizes are used.

Examples of materials and dyes are described in the following patent specifications:
U.K. Pat. No. 1,433,130
U.K. Pat. No. 1,441,571
U.K. Pat. No. 1,452,826
U.K. Pat. No. 1,555,955
U.K. Patent Application No. 2,011,940 A
U.K. Patent Application No. 2,043,097 A
U.K. Patent Application No. 2,082,196 A
U.K. Patent Application No. 82 05,153

The liquid crystal material may be E7 or E43, with CB 15 (all available from BDH Chemicals Ltd., Poole, Dorset) and the dyes may be D1, D2, D16, D35, D80, D81, D82.

E7 has the composition

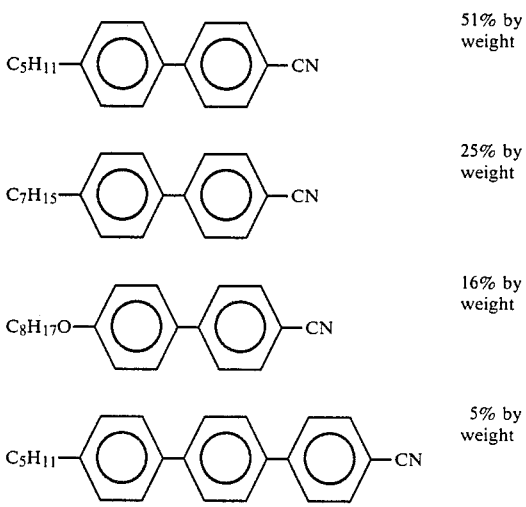

One suitable dye has the structure:

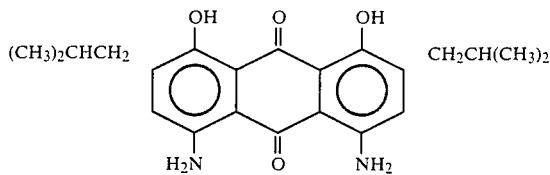

The display cell of FIGS. 1, 2 is used as both a switch component and display cell. That is, the same area that displays information, the seven-bar format, is also pressed by an operator's finger 12.

Figure 3:
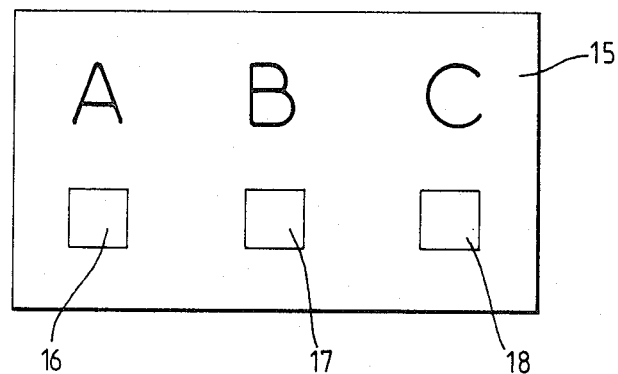
FIG. 3 is a front view of a multi-function display cell having separate touch areas.

The display of FIG. 3 is a multi-function display capable of displaying three functions marked A, B, and C in different areas of a single large cell 15. Beneath each function A, B, C is a touch area 16, 17, 18 which may be of a different texture to assist night time location. Each function A, B, C and touch area 16, 17, 18 is defined by electrode patterns on the inner faces of the cell and independently and selectively supplied with appropriate voltage signals.

In large area displays accurate spacing of the walls over the whole cell may be achieved using short lengths, e.g. 50 μm diameter glass fibres. These fibre spacers are arranged over the whole area of walls. Since the touch areas 16, 17, 18 must be capable of wall deflection spacers are not used in these parts of the display. Spacers are preferably used between adjacent touch areas 16, 17, 18 to provide isolation. Each touch area 16, 17, 18 is a separate switch element.

Figure 4:
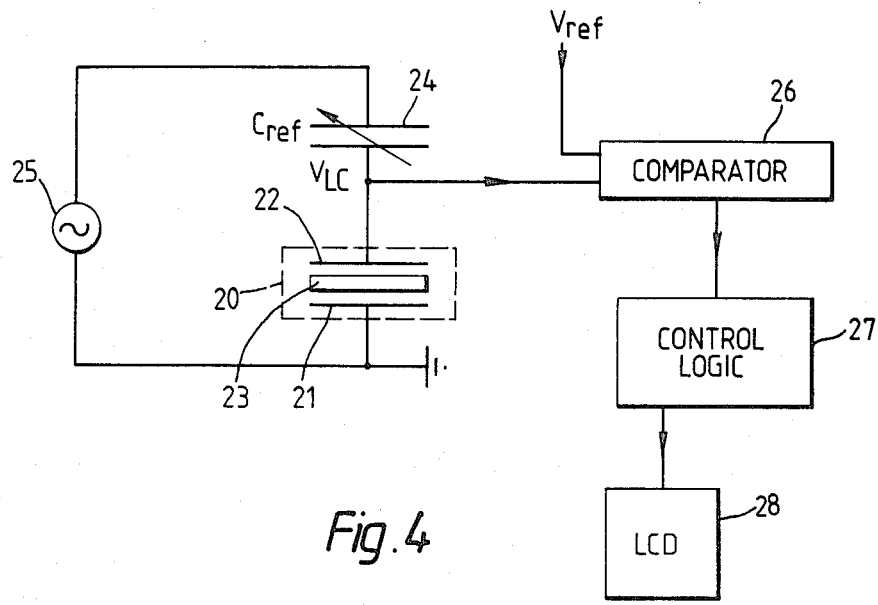
FIG. 4 is a circuit diagram with separate touch switch and display cells.

FIG. 4 shows a circuit diagram of a touch switch. It comprises a liquid crystal cell 20, e.g. as FIG. 2, with spaced electrodes 21, 22 and a layer 23, of liquid crystal material. A reference capacitor 24 is connected in series with the cell 20. A voltage source 25 of e.g. 100 Hz frequency is applied to the reference capacitor 24 and cell 20. The voltage developed between the reference capacitor and cell $V_{LC}$ is fed into a comparator 26 also supplied with a reference voltage $V_{ref}$. Output from the comparator 26 is to a control logic 27 that switches voltage to a liquid crystal display 28 e.g. FIG. 1 or appropriate parts of FIG. 3, as required. The reference capacitor 24 may be adjustable in capacitance value and may be around 100 times the value of the cell 20 element capacitance. For example $C_{ref}$ may be $10^5$ pF and the cell $C_{LC} = 10^3$ pF.

Figure 5:
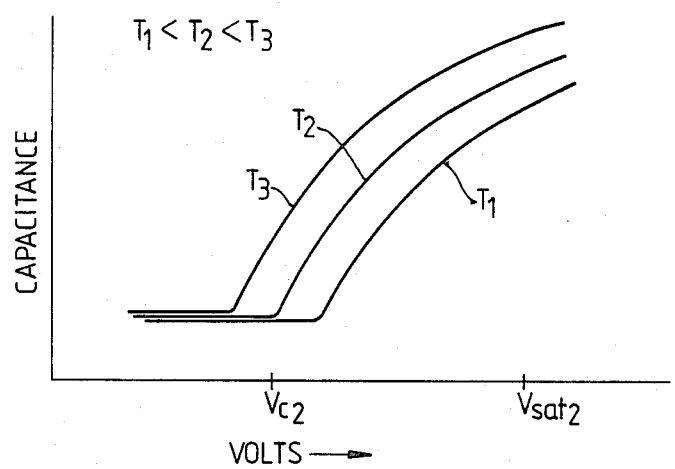
FIG. 5 is a graph showing cell capacitance variation with applied voltage for different cell temperatures.

The capacitance of and optical transmission through a liquid crystal cell having low surface tilt angles e.g. below 15° varies with applied voltage as shown in FIG. 5. For low applied voltages capacitance remains constant until a critical value Vc is reached. This corresponds to the point at which liquid crystal molecules start to turn towards their ON state. Above Vc capacitance increases. The curve is displaced to the left for increasing liquid crystal temperature and to the right for decreasing temperature. The point $V_{sat}$ is the value giving a fully optically ON cell. Normally displays are switched on by a voltage above $V_{sat}$ and turned OFF by voltages below $V_c$ preferably zero voltage.

The value of the voltage of the voltage supply 25 FIG. 4 is adjusted so that the voltage $V_{LC}$ across the cell 20 is between $V_c$ and $V_{sat}$. For display cells having low e.g. 2° molecular tilt at the cell walls the value of $V_{LC}$ is preferably between $V_c$ and 5 $V_c$. For higher tilt values $V_{LC}$ may be between zero and 5 $V_c$. The value of $V_{ref}$ is adjusted to equal $V_{LC}$. In this condition the output of the comparator 26 is zero and the liquid crystal display 28 remains in its set state e.g. OFF state.

When finger pressure is applied to the centre of the front wall of the switch cell 20 it bends, bringing the opposing electrodes 21, 22 closer together, displacing some liquid crystal material and changing the alignment of the molecules. As a result the capacitance changes and $V_{LC}$ changes. The comparator 26 gives an output to the control logic which alters the state of the display 28 e.g. switches it ON. On removal of pressure the cell 20 reverts back to its original shape and capacitance. The comparator 26 output is zero and the display remains in its ON state. Further finger pressure on the switch cell 20 causes the display 28 to switch to OFF.

A capacitance change occurs when the deforming pressure is removed. Thus two capacitive changes are associated with touch. Either change may be used by the logic 27 i.e. one change is ignored. Alternatively both changes may be used, e.g. a double change is required to provide an output from the logic 27.

Other switching effects are possible depending on the complexity of display 28 and control logic 27. For example it may be arranged that continued pressure on the switch cell 20 indexes the display 20 e.g. from displaying zero to nine etc. until pressure is released.

Visual confirmation of a switching action may be arranged by flashing of a light behind the touched area e.g. areas 16, 17, 18 of FIG. 3. Alternatively audible confirmation of switching may be arranged.

For displays operating over a wide ambient temperature range, temperature compensation may be used. Such compensation may adjust $V_{ref}$ and/or the voltage supply 25 to maintain $V_{LC}$ between $V_C$ and $V_{sat}$ when the switch cell 20 is undeformed.

One method of temperature compensation is described in U.K. Patent Specification No. 2,012,093 A. A voltage is applied across a fixed capacitor and a liquid crystal cell in series. This is similar to the arrangement of FIG. 4. The voltage developed across the cell is a measure of liquid crystal temperature and is used to adjust the voltage level applied to drive adjacent liquid crystal displays.

Thus in the present case the voltage $V_{LC}$ developed across one area of display cell, near a touch area, could be used to vary the voltage source and $V_{ref}$. Additionally or alternatively the temperature measurement could be used to control cell heaters.

Twisted nematic cells using high surface tilt angles, e.g. 30°, are sensitive to finger pressure for values of applied voltages below $V_c$. In this case it is not necessary to arrange $V_{LC}$ to lie between $V_C$ and $V_{SAT}$.

Greater sensitivity can be provided by thinner glass front walls or even flexible plastic such as polyester, polyacrylate, polyurethene, etc.

As an alternative to, or in addition to, the temperature compensation described above a band pass filter may be incorporated in the supply to the comparator 26. This filter may attenuate very low frequency changes in voltage, e.g. caused by temperature fluctuations, and also higher frequency changes e.g. caused by vibrations such as experienced in the dashboard of a car.

Figure 6:
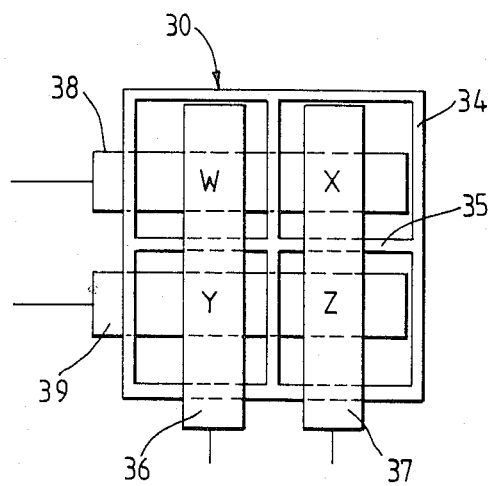
FIGS. 6, 7 are front and side views of an alternative touch switch cell having four touch areas forming a bridge circuit.
Figure 7:
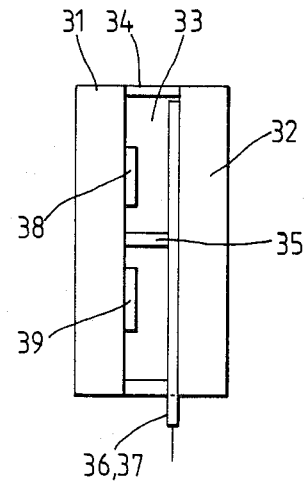
Figure 8:
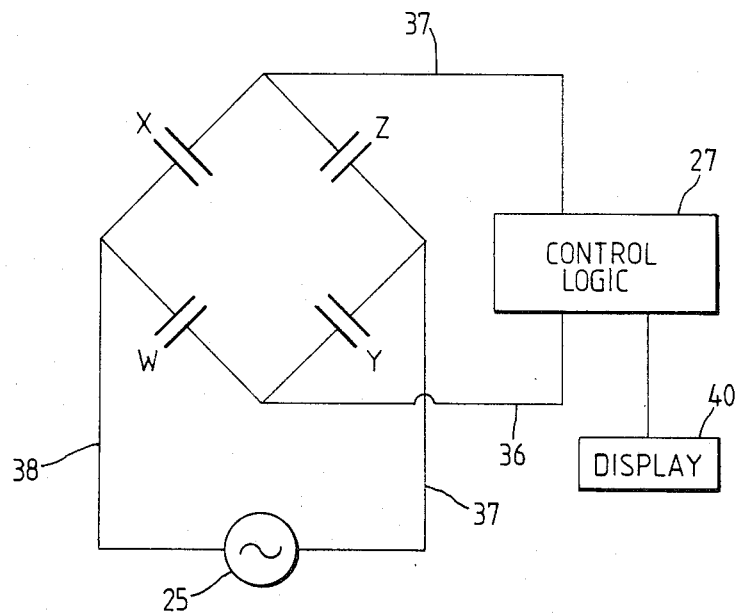
FIG. 8 is a circuit diagram of FIGS. 6, 7.

FIGS. 6, 7, and 8 show an alternative touch switch arranged as a bridge circuit. This removes the necessity to use a reference capacitor 24 and reference voltage.

The cell 30 comprises two 2 mm thick glass slides 31, 32, enclosing a 12 μm thick liquid crystal layer 33. A spacer ring 34 and partitions 35 maintain the slide separation where required. The top slide 31 carries two parallel strip electrodes 36, 37 whilst the bottom slide 32 carries two parallel strip electrodes 38, 39 orthogonal to the top electrodes. Material and slide surface treatment are as described above. This arrangement provides four electrode intersections marked W, X, Y, Z. These four intersections W, X, Y, Z form four capacitors arranged in a bridge as shown in FIG. 8. A voltage supply 25 e.g. of 100 Hz frequency is supplied between the top electrodes 38, 39 at a value between $V_c$ and $V_{sat}$ e.g. 1 to 12 volts or more depending on material and thickness etc. An output is taken between the bottom electrodes 36, 37 to control logic 27 which controls a display 40 or other electrically operated device.

In use as a touch switch the output of the bridge circuit is zero because all four capacitors W, X, Y, Z have equal value. This situation remains substantially true for all reasonable temperatures and with cell ageing. When any one capacitors W, X, Y, or Z is touched its capacitance changes and the bridge is unbalanced. A voltage then appears between the bottom electrodes 36, 37 and is used by the control logic 27 as required.

The capacitors W, X, Y, Z can take any shape but should have the same capacitance. Since only one capacitor needs to be touched the others may form part of a non-touch display.

The arrangement of FIGS. 6, 7, 8 may be modified to use just two liquid crystal capacitive areas connected to resistors to form the bridge. For example capacitors X, Z may be replaced by a centre tapped resistor. The precise point of tapping is adjustable to balance the bridge. An advantage of this arrangement over that of FIG. 4 is a balance over a full operating temperature range.

I claim:

1. A touch sensitive switch comprising:
   a liquid crystal cell formed by a layer of liquid crystal material contained between two electrode bearing slides,
   means for applying a voltage to the electrodes above a threshold value at which liquid crystal molecules begin to rotate under the effect of the electric field caused by the applied voltage,
   means for detecting a change in cell capacitance between said electrodes when the cell is deformed, and
   means for producing a signal indicating said detected capacitance change.

2. The switch according to claim 1 wherein the cell is arranged to change displayed information in at least a part of the cell area.

3. The switch according to claim 2 wherein that part of the cell displaying information is arranged to be deformable by an operators touch.

4. The switch according to claim 2 wherein that part of the cell displaying information is separate from that part deformable by an operators touch.

5. The switch according to claim 1 wherein the means for detecting a change in capacitance includes a balanced bridge circuit which is unbalanced on deformation of the cell which forms a part of the bridge.

6. The switch according to claim 5 wherein a plurality of cells are connected into the bridge circuit.

7. The switch according to claim 1 wherein the liquid crystal material is a nematic material.

8. The switch according to claim 1 wherein the liquid crystal material is a cholesteric material.

9. The switch according to claim 1 wherein an amount of a dye is dissolved in the liquid crystal material.

10. The switch according to claim 1 wherein the facing surfaces of the slides are treated to align contacting liquid crystal molecules at an angle to the surfaces.

11. The switch according to claim 1 wherein the means for detecting a change in capacitance includes means for supplying a voltage across the cell and a reference capacitor connected together in series, and a comparator for comparing the voltage developed across the cell with a reference voltage.

12. A touch sensitive switch comprising:

a liquid crystal cell formed by a layer of liquid crystal material contained between two electrode bearing slides, the slides being surface treated to give a molecule tilt above 10° to the liquid crystal molecules at the slide surface, means for detecting a change in cell capacitance between said electrodes when the cell is deformed, and means for producing a signal indicating said detected capacitance change.

* * * * *